United States Patent [19]

Beirne et al.

[11] 4,321,431
[45] * Mar. 23, 1982

[54] TRUNK CIRCUIT WITH SINGLE COUPLING TRANSFORMER

[75] Inventors: Patrick R. Beirne, Stittsville; Michael C. J. Cowpland, Ottawa; Raymond J. Whitbread, Ashton, all of Canada

[73] Assignee: Mitel Corporation, Ontario, Canada

[*] Notice: The portion of the term of this patent subsequent to Jan. 8, 1997, has been disclaimed.

[21] Appl. No.: 69,054

[22] Filed: Aug. 23, 1979

Related U.S. Application Data

[63] Continuation-in-part of Ser. No. 925,297, Jul. 17, 1978, Pat. No. 4,182,936.

[30] Foreign Application Priority Data

Feb. 28, 1978 [CA] Canada ................................. 297883

[51] Int. Cl.³ .............................................. H04M 7/04
[52] U.S. Cl. ................................................ 179/18 AH
[58] Field of Search ......... 179/18 AH, 16 EA, 16 EC, 179/170 NC, 170 T

[56] References Cited

U.S. PATENT DOCUMENTS

| | | | |
|---|---|---|---|
| 3,855,430 | 12/1974 | Colardelle et al. | 179/170 NC |
| 4,128,743 | 12/1978 | Huellwegen | 179/170 R |
| 4,163,878 | 8/1979 | Hashemi | 179/170 NC |
| 4,174,470 | 11/1979 | Seidel | 179/170 NC |

*Primary Examiner*—Thomas W. Brown
*Attorney, Agent, or Firm*—Craig and Antonelli

[57] ABSTRACT

A trunk circuit comprises a first lead pair for carrying two-way signals, a second lead pair for carrying two-way signals, a circuit for electrically coupling an incoming signal from the second lead pair to the first lead pair, a first transformerless circuit for applying an incoming signal from the first lead pair to the second lead pair, and a second transformerless circuit for preventing signals from the first circuit applied to the first lead pair from being reapplied to the second lead pair and for preventing signals from the first transformerless circuit applied to the second lead pair from being reapplied to the first lead pair. Preferably the coupling circuit is comprised of a transformer having a primary winding connected in a low impedance voltage source circuit to the second lead pair, and having a secondary winding connected in a very high impedance-to-direct-current circuit for applying the incoming signal from the second lead pair to the first lead pair. Due to the resulting very low current levels in the transformer, the effective bandwidth of the transformer is substantially increased, allowing use of an inexpensive transformer which can readily be incorporated on a plug-in printed circuit board.

24 Claims, 2 Drawing Figures

TRUNK CIRCUIT WITH SINGLE COUPLING TRANSFORMER

CROSS-REFERENCE TO RELATED APPLICATIONS

The present application is a continuation-in-part of U.S. patent application Ser. No. 925,297, filed July 17, 1978 for "Transformerless Trunk Circuit", now U.S. Pat. No. 4,182,936, issued Jan. 8, 1980.

FIELD OF THE INVENTION

The present invention relates to a bidirectional amplifier, particularly to a bidirectional trunk circuit for coupling a first pair of leads such as a trunk to a second pair of leads such as a junctor.

BACKGROUND OF THE INVENTION

As is described in our above-referenced co-pending parent application Ser. No. 925,297, assigned to the assignee of the present application, trunk circuits have particular characteristics and requirements which previously have involved the use of hybrid transformers; reference may be had to the description of such attributes of trunk circuits set forth in the above-referenced application, which application is incorporated by reference in the present application, for a detailed explanation of both the prior art and applicants' contribution to the art using a transformerless trunk circuit that involves a circuit configuration containing photoelectronic components.

Now, although the specific invention disclosed and claimed in our above-referenced co-pending application offers a significant improvement over conventionally configured trunk circuits containing hybrid transformers, we have also found that the signal cancellation effects described in our former application can also be obtained with the use of a somewhat simpler structure by which the photocoupled circuitry is replaced by an inexpensive transformer coupled stage.

SUMMARY OF THE INVENTION

In accordance with the further improvement hereinafter described, no hybrid transformer signal coupling need be utilized with attendant impedance balancing requirements, and while an inexpensive transformer is utilized to couple the signal passing from one direction to the second, a transformerless circuit is used to couple the signal passing in the opposite direction. Furthermore, transformerless circuits are used to prevent signals originating from either direction from being fed back thereto. The present embodiment is thus an improved form of the invention described with reference to FIG. 1 of our above-referenced parent application.

BRIEF DESCRIPTION OF THE INVENTION

In general the embodiment of the invention to be described below is a trunk circuit comprising a first lead pair for carrying two-way signals, a second lead pair for carrying two-way signals, a coupling circuit for electrically coupling an incoming signal from the second lead pair to the first lead pair, a first transformerless circuit for applying an incoming signal from the first lead pair to the second lead pair, and a second transformerless circuit for preventing signals from the coupling circuit applied to the first lead pair from being reapplied to the second lead pair and for preventing signals from the first transformerless circuit applied to the second lead pair from being reapplied to the first lead pair.

Preferably, the coupling circuit is comprised of a transformer having a primary winding connected in a low impedance voltage source circuit to the second lead pair, and having a secondary winding connected in a very high impedance to direct current circuit for applying the incoming signal from the second lead pair to the first lead pair. Due to the resulting very low current levels in the transformer, the effective band width of the transformer is substantially increased, allowing use of an inexpensive transformer which can be readily incorporated on a plug-in printed circuit board.

DETAILED DESCRIPTION

Figure 1:
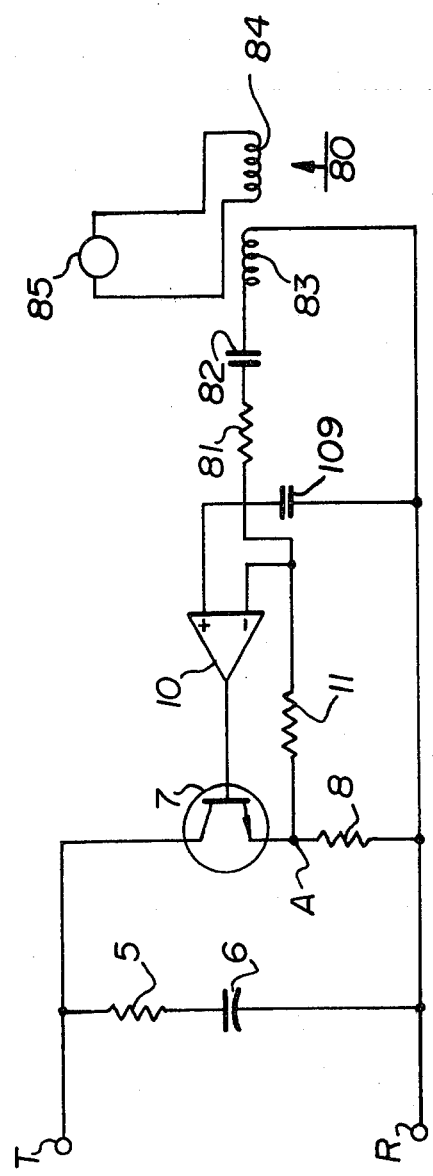
FIG. 1 is a schematic illustration of the improved circuit of the present invention in simplified form.
Figure 2:
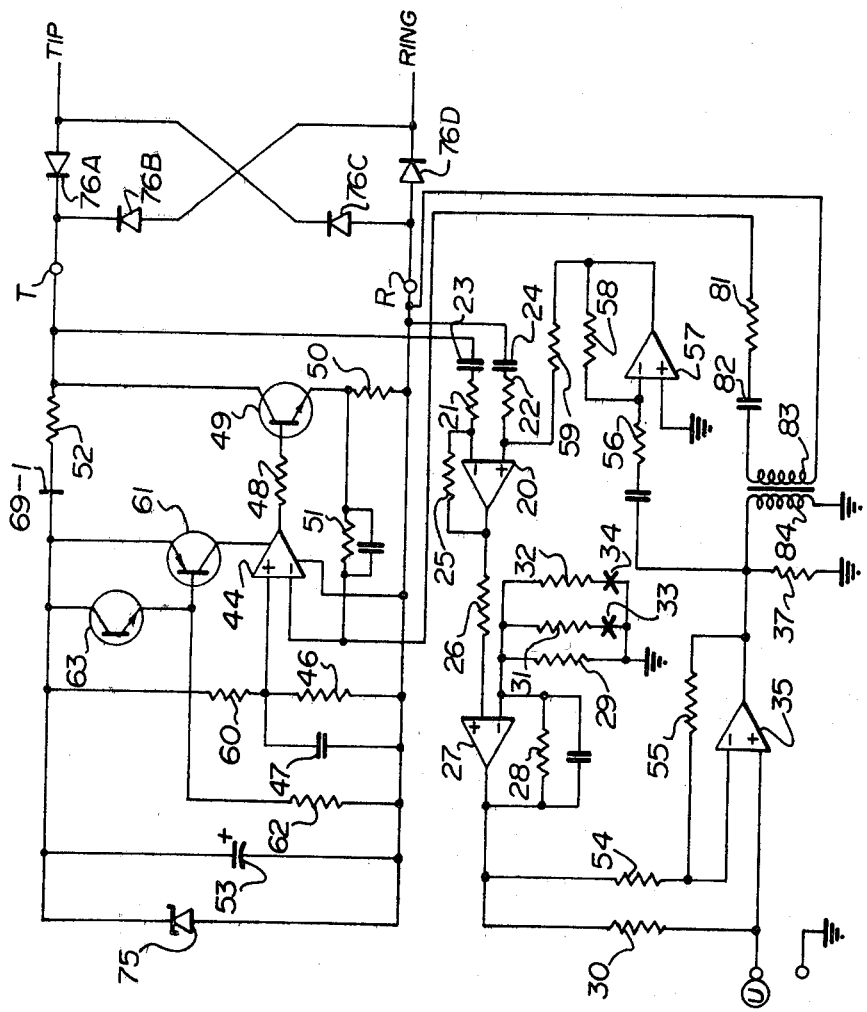
FIG. 2 is a detailed schematic illustration of a preferred embodiment of the present invention.

Turning now to FIG. 1, it will be noted that the configuration shown therein is similar to that shown in FIG. 2 of our above-referenced parent application except for the deletion of the photosensitive diode 9 and photoemissive diodes 14 and 15. Also, the operational amplifier 12 is not shown in FIG. 1, but a circuit of similar form may be utilized.

In place of photosensitive diode 9 (FIG. 2 of application Ser. No. 925,297), an inexpensive transformer 80 is used which has a high impedance-to-direct current circuit connected to its secondary winding. The high impedance circuit, including the secondary winding of transformer 80 in series, should be connected between the inverting input of operational amplifier 10 and the junction between resistor 8 and ring lead R, which junction is connected for A.C. to the non-inverting input of operational amplifier 10, e.g. through capacitor 109.

The circuit which has high resistance to D.C. is comprised of resistor 81 in series with capacitor 82, in series circuit with secondary winding 83 of transformer 80.

Capacitor 82 allows modification of the frequency response of the circuit besides being of infinite resistance to D.C., and its presence is optional. The value of resistor 81 in one model of the present invention was 10,000 ohms.

The primary winding 84 of transformer 80 is connected in a circuit to a low impedance voltage source 85. This voltage source preferably is formed by the output circuit of operational amplifier 12 of FIG. 2 of application Ser. No. 925,297.

In operation, the transformer 80 is driven by signals originating at terminal U and translated through operational amplifier 12 depicted in FIG. 2 of our above-referenced parent application. The signal is applied to resistor 81. Since virtually no (or very little) direct current flows through the secondary of the transformer, its frequency and amplitude characteristics are optimized. Since there is virtually no loading of the transformer, a size reduction of two can be realized, and an additional size reduction of four to six can be realized due to there being virtually no direct current flow through the secondary winding.

The signal current flow can be calculated by multiplying the ratio of the signal voltage at the low impedance source and the value of resistor 81 by the ratio of resistors 11 to 8 times the normalized filter transmission characteristics formed by capacitor 82 and resistor 81.

It is prefered that the primary and secondary windings of the transformer are wound so that stray capacitances to ground are not amplified by operational amplifier 10. Accordingly, it is preferred that the ends of the primary and secondary windings which are not connected to, or adjacent the ring lead (or low impedance node) should be separated as widely as possible in order to provide lowest capacitance therebetween.

FIG. 2 depicts a detailed schematic diagram of the present invention. Comparing it to FIG. 3 of our above-referenced co-pending application, it will be noted that transistor 40, resistor 41, light emitting diodes 42 and 43 and a light sensitive diodes 39 and 45 have been eliminated. In their place is disposed the transformer described above with reference to FIG. 2 herein, having its primary winding 84 connected to the output of operational amplifier 35 and ground. Secondary winding 83 has one terminal connected to the ring lead terminal R, and its other lead connected through the series circuit of capacitor 82 and resistor 81 to the inverting input of operational amplifier 44.

With the application of an input signal to terminal U, which signal is translated in operational amplifier 35, it passes through the low impedance input circuit to the primary winding 84 and the high impedance circuit connected to the secondary winding 83 of the transformer, and is applied between terminal R and the inverting input of operational amplifier 44. The presence of capacitor 82 effectively bars the passage of direct current through the secondary winding, and also can be used to limit the low frequency response of the circuit path, with resistor 81. However, even if capacitor 82 were omitted, the high resistance of resistor 81 would limit the flow of direct current to a very low level.

It may be seen that the improvement provided by the present circuit substitutes adequately for the photocoupled circuit described in our above-referenced parent application. The remainder of the circuit operates as described with reference to FIG. 3 in that application, including the transformerless circuit coupling signals from the tip and ring leads to the U lead, and the signal cancellation circuits.

It should be noted that the secondary winding 83 of the transformer can be connected in a circuit to the input of a coder-decoder or other four wire apparatus, rather than to operational amplifier 44. The output of the coder-decoder can be connected to the T and R terminals (FIG. 2), removing the requirement of diodes 76A, 76B, 76C and 76D, and the input of the coder-decoder can be connected in a circuit to the secondary winding 83. In this structure the need for one of the circuit means to cancel signals from the unbalanced pair from feeding back thereto can be deleted. Hence operational amplifier 57, resistors 56, 58 and 59 and capacitor 55 can be removed. The impedance of the T and R terminals and the output circuit connected to the secondary winding 83 can be adjusted in a manner known to persons skilled in the art to match the output and input circuits respectively of a coder-decoder or other four-wire apparatus.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A signal translation circuit comprising:
   (a) tip and ring terminals for connection to tip and ring leads, for carrying signals including a direct current,
   (b) an A.C. terminating impedance connected between the tip and ring terminals,
   (c) a high impedance signal source connected between the tip and ring terminals, having a circuit path for conduction of direct current therebetween,
   (d) means for controlling the signal source including a transformer having a low impedance input circuit connected to its primary winding, and a high resistance-to-D.C. output circuit connected to its secondary winding, which is connected to the signal source for controlling the passage of current through said circuit path as a function of a voltage applied to the primary winding of the transformer, so as to apply a desired signal to the tip and ring terminals,
   (e) means for connecting a lead pair, including a terminal for carrying trunk signals,
   (f) an operational amplifier means having its output connected to the low impedance circuit, and its input connected in a signal path to the terminal for carrying trunk signals,
      whereby the tip and ring terminals are caused to carry signal currents corresponding to a signal current appearing at said terminal for carrying trunk signals,
   (g) first transformerless circuit means adapted to apply an incoming signal from the tip and ring terminals to said lead pair,
   (h) second transformerless circuit means adapted to prevent trunk signals from the said lead pair applied to the tip and ring terminals from being reapplied to said lead pair, and
   (i) third transformerless circuit means adapted to prevent signals from said first transformerless circuit means applied to said lead pair from being reapplied to the tip and ring terminals.

2. A signal translation circuit as defined in claim 1 in which the high impedance signal source is comprised of the collector-emitter circuit of a transistor having a low resistance resistor connected in series therewith, the base electrode of the transistor being connected to the output of a second operational amplifier means, the high impedance input circuit of the transformer being connected between one of the inputs of the second operational amplifier means and the tip or ring lead, and also including a further resistor connected between said one of the inputs of the second operational amplifier means and the junction between the low resistance series resistor and the transistor, and further circuit means providing a low A.C. impedance path from said other input of the second operational amplifier means to said tip or ring lead.

3. A signal translation circuit as defined in claim 2 in which the high impedance input circuit of the transformer is connected between the inverting input of the second operational amplifier means and the ring lead, and the low resistance resistor is connected between the emitter of the transistor and the ring lead.

4. A signal translation circuit as defined in claim 1, 2 or 3, in which the first transformerless circuit means includes a first differential amplifier having a pair of inputs, each connected respectively through a high impedance to the tip and ring terminals, and an output connected via a circuit path through a matching impedance to said terminals for carrying trunk signals; and the second transformerless circuit means includes a second differential amplifier having one input connected to said terminal for carrying trunk signals and another input connected through a first balancing impedance to the circuit path connected to the output of the first differential amplifier; the second differential amplifier being connected in series with a circuit path through a second balancing impedance to one of the inputs of the first differential amplifier comprising the third transformerless circuit means, the first balancing impedance being of such value as to apply signal to the second differential amplifier at a level such as to cancel signals therein arriving from the tip and ring leads, and the second balancing impedance being of such value as to apply signals from the second differential amplifier at a level such as to cancel signals therein arriving from the unbalanced terminal of the unbalanced lead pair.

5. A trunk circuit comprising:
(a) a pair of terminals for connection to a tip and a ring lead,
(b) a first resistor for matching the impedance of a telephone line which may be connected to said terminals, connected in series with a capacitor having large capacitance for providing a low impedance to voice frequency signals, the series circuit being connected between said terminals,
(c) an operational amplifier having a pair of inputs, one input being connected for AC through a high impedance circuit in series with the secondary winding of a transformer,
(d) a transistor having its emitter connected through a low valued resistor to one of said terminals, its collector connected to the other terminal, and its base in a circuit path to the output of the operational amplifier,
(e) a high valued resistor connected between said one input of the operational amplifier and the junction between the low valued resistor and the emitter,
(f) a further operational amplifier, having its output connected in a low impedance circuit to the primary winding of the transformer,
(g) means for applying an unbalanced signal between the input terminals of the further operational amplifier,
(h) first transformerless circuit means adapted to apply an incoming signal from the tip and ring terminals to said lead pair,
(i) second transformerless circuit means adapted to prevent trunk signals from the said lead pair applied to the tip and ring terminals from being reapplied to said lead pair, and
(j) third transformerless circuit means adapted to prevent signals from said first transformerless circuit means applied to said lead pair from being reapplied to the tip and ring terminals.

6. A trunk circuit as defined in claim 5, further including means for connecting power supply and bias leads of the first operational amplifier across the terminals of the capacitor and for supplying operating and bias voltage for the first operational amplifier thereby.

7. A trunk circuit as defined in claim 5, in which the means for applying an unbalanced signal is comprised of a third terminal for carrying a signal relative to common or ground, a third operational amplifier having an input connected to the third terminal and an output connected in a signal path to an input of the further operational amplifier, and comprising means for applying a trunk signal from said pair of terminals to said third terminal, and means for preventing signals passing through the further operational amplifier from said pair of terminals, from being translated by said means for applying a trunk signal and thus being applied to said third terminal.

8. A trunk circuit as defined in claim 7, comprising means for preventing signals passing through said means for applying a trunk signal from being translated by the second operational amplifier and thus being applied to said pair of terminals.

9. A trunk circuit as defined in claim 8, in which said means for applying a trunk signal and both said means for cancelling signals are comprised of a first differential amplifier having each of its inputs connected through resistors to corresponding ones of said pair of terminals, the value of each of the resistors being at least 100 times the impedance of the telephone line, a signal path connected from the output of the first differential amplifier to said third terminal, a signal path for applying a first predetermined portion of the output signal of the first different amplifier connected from the output of the first differential amplifier to a second inverting input of the third operational amplifier, a fourth operational amplifier connected in a signal path with its input connected to the output of the third operational amplifier and its output connected to one of the inputs of the first differential amplifier for applying a second predetermined portion of the output signal of the fourth operational amplifier to the first differential amplifier, wherein said first predetermined portion is sufficient to prevent signals input to said pair of terminals from being translated in the third operational amplifier and said second predetermined portion is sufficient to prevent signals input to said third terminal from being translated by said first different amplifier.

10. A trunk circuit as defined in claim 9, further including a fifth operational amplifier connected between the output of the first differential amplifier and the signal path to said third terminal, a resistor of value to match an external impedance between said third terminal and ground connected in series circuit between the output of the fifth differential amplifier and said third terminal, said signal path for applying a first predetermined portion of the output signal comprising a resistor connected to the output of the fifth operational amplifier.

11. A trunk circuit as defined in claim 10, in which the gain of the first differential amplifier is about 1/10, the gain of the fifth operational amplifier is at least about 2, the gain of the third operational amplifier is sufficient to bring the level of a signal originating on said third terminal to the level of the signal originating at the pair of terminals, and the gain of the fourth operational amplifier is about ½.

12. A trunk circuit as defined in claim 10 or 11, further including means for selectively increasing the gain of the fifth operational amplifier, whereby the level of the signal applied to said third terminal can be increased.

13. A trunk circuit as defined in claim 5, 7 or 11 further including a bridge rectifier connected between the pair of terminals and tip and ring leads.

14. A trunk circuit comprising:

(a) a first lead pair for carrying two-way signals,
(b) a second lead pair for carrying two-way signals,
(c) means for electrically coupling an incoming signal from the second lead pair to the first lead pair,
(d) first transformerless circuit means for applying an incoming signal from the first lead pair to the second lead pair,
(e) second transformerless circuit means for preventing signals from the means for electrically coupling applied to the first lead pair from being applied to the second lead pair and for preventing signals from the first transformerless circuit means applied to the second lead pair from being applied to the first lead pair.

15. A trunk circuit comprising:
(a) a first lead pair,
(b) a second lead pair,
(c) means for electrically coupling an incoming signal from the second lead pair to the first lead pair,
(d) first transformerless circuit means for applying an incoming signal from the first lead pair to the second lead pair,
(e) second transformerless circuit means for preventing signals from said means for electrically coupling applied to the first lead pair from being applied to the second lead pair and
(f) third transformerless circuit means for preventing signals from said first transformerless circuit means applied to the second lead pair from being applied to the first lead pair.

16. A trunk circuit as defined in claim 15, in which the means for electrically coupling includes a transformer having its primary winding connected to a low impedance input circuit which is connected in a circuit to the second lead pair, and having its secondary winding connected in a circuit having very high resistance to direct current to an output circuit connected to the first lead pair.

17. A trunk circuit as defined in claim 16, in which the very high resistance circuit includes a capacitor connected in series therewith.

18. A trunk circuit as defined in claim 17, further including a current source, adapted to conduct current in response to a signal translated by the transformer, connected between the leads of the first lead pair.

19. A trunk circuit as defined in claim 18, in which the current source is comprised of the collector-emitter circuit of a transistor, the input of the transistor being connected to the output of an operational amplifier having an input to which the very high resistance circuit is connected.

20. A trunk circuit as defined in claim 16, 17 18 or 19, further including means terminating the first lead pair with a matching A.C. impedance and a resistance means for conducting D.C. between the leads.

21. A trunk circuit comprising:
(a) a first lead pair,
(b) a second lead pair,
(c) a third lead pair,
(d) means for applying an incoming signal from the second lead pair to the third lead pair, said means including a transformer having its primary winding connected to a low impedance input circuit which is connected in a circuit to the second lead pair, and its secondary winding connected in a circuit to the third lead pair,
(e) first transformerless circuit means for applying an incoming signal from the first lead pair to the second lead pair, and
(f) second transformerless circuit means for preventing signals from said first circuit means applied to the second lead pair from being applied to the third lead pair.

22. A trunk circuit as defined in claim 21, and having its secondary winding connected in a circuit having very high resistance to direct current to an output circuit connected to the third lead pair.

23. A trunk circuit as defined in claim 22 in which the very high resistance circuit includes a capacitor connected in series therewith.

24. A trunk circuit as defined in claim 21 or 22, further including means terminating the first lead pair with a first matching A.C. impedance.

* * * * *